United States Patent [19]

Partlo et al.

[11] Patent Number: 6,028,872
[45] Date of Patent: Feb. 22, 2000

[54] HIGH PULSE RATE PULSE POWER SYSTEM WITH RESONANT POWER SUPPLY

[75] Inventors: William N. Partlo, Poway; Daniel L. Birx, Oakley; Richard M. Ness, San Diego; Daniel A. Rothweil, San Diego; Paul C. Melcher, El Cajon; Brett D. Smith, San Diego, all of Calif.

[73] Assignee: Cymer, Inc., San Diego, Calif.

[21] Appl. No.: 09/211,825

[22] Filed: Dec. 15, 1998

Related U.S. Application Data

[63] Continuation-in-part of application No. 08/990,848, Dec. 15, 1997, Pat. No. 5,940,421, and a continuation-in-part of application No. 08/995,832, Dec. 22, 1997, and a continuation-in-part of application No. 09/118,773, Jul. 18, 1998, Pat. No. 5,936,988.

[51] Int. Cl.[7] ............................................. H01S 3/00
[52] U.S. Cl. ............................ 372/38; 372/25; 372/30; 372/81; 372/82
[58] Field of Search .................................. 372/33, 38, 39, 372/81, 82, 25, 30

[56] References Cited

U.S. PATENT DOCUMENTS

| | | | |
|---|---|---|---|
| 4,258,334 | 3/1981 | McCusker et al. | 372/57 X |
| 4,549,091 | 10/1985 | Fahlen et al. | 372/38 X |
| 4,606,034 | 8/1986 | Eden et al. | 372/57 |
| 4,611,327 | 9/1986 | Clark et al. | 372/58 |
| 4,710,939 | 12/1987 | Birnbach et al. | 372/73 |
| 4,740,982 | 4/1988 | Hakuta et al. | 372/59 |
| 4,964,137 | 10/1990 | Aramaki et al. | 372/59 |
| 5,138,622 | 8/1992 | Friede et al. | 372/38 |
| 5,142,543 | 8/1992 | Wakabayashi et al. | 372/32 |
| 5,463,650 | 10/1995 | Ito et al. | 372/57 |
| 5,642,374 | 6/1997 | Wakabayashi et al. | 372/57 |
| 5,710,787 | 1/1998 | Amada et al. | 372/25 |
| 5,729,562 | 3/1998 | Birx et al. | 372/38 |
| 5,936,988 | 8/1999 | Partio et al. | 372/38 |
| 5,940,421 | 8/1999 | Partio et al. | 372/38 |

*Primary Examiner*—Brian Healy
*Attorney, Agent, or Firm*—John R. Ross

[57] ABSTRACT

A high pulse rate pulse power source for supplying controlled high energy electrical pulses at rates of 2000 Hz or greater. The source includes a pulse generating circuit including a charging capacitor, a solid state switch and a current limiting inductor. Pulses generated in the pulse generating circuit are compressed in at least two pulse compression circuits and a step-up pulse transformer increases peak voltage to at least 12,000 volts. A very fast regulated resonant power supply is provided for charging the charging capacitor in less than 400 microseconds and a pulse control system including a programmed processor controls the charging of the charging capacitor to an accuracy of less than about one percent at a rate of at least 2000 charges per second.

6 Claims, 12 Drawing Sheets

HIGH PULSE RATE PULSE POWER SYSTEM WITH RESONANT POWER SUPPLY

The present invention is a continuation-in-part of U.S. Ser. No. 08/990,848 filed Dec. 15, 1997, now U.S. Pat. No. 5,940,421; U.S. Ser. No. 08/995,832 filed Dec. 22, 1997, pending; and U.S. Ser. No. 09/118,773 filed Jul. 18, 1998, now U.S. Pat. No. 5,936,988. This invention relates to pulse power systems and in particular to high pulse rate pulse power systems for electric discharge lasers.

BACKGROUND OF THE INVENTION

In typical gas discharge lasers a gain medium is created by an electric discharge between two elongated electrodes into a circulating gas. Very high voltages are usually required to initiate the discharge but once the discharge begins, a plasma is created which reduces the electrical resistance between the electrodes to almost zero, effectively creating what is almost a short circuit. This requires a method to limit the current once the discharge has started. A common method to deal with the two issues is to provide a "peaking" capacitor (Cp) in parallel with the electrodes. The peaking capacitor is periodically charged with the voltage needed to initiate the discharge but with only enough electrical energy for one pulse. The almost short circuit between the electrodes created by the high voltage drains the peaking capacitor of its energy which terminates the pulse. In high pulse rate electric discharge lasers (e.g., 1000 pulses per second) a gas circulating system produces a gas flow (such as 1,000 inches/second) between the electrodes which quickly replaces the ionized gas between the electrodes resulting from each pulse with fresh gas prior to the next pulse. The next pulse is generated by another quick charge on the peaking capacitor similar to the prior one. Thus, it is the job of the pulse power system to provide on the peaking capacitor sufficient voltage and electrical energy for one pulse at a desired pulse rate, such as 1,000 times per second.

In a prior art system, the peaking capacitor is charged from a 12–20 kv DC power source using a high voltage switch to charge a charging capacitor, Co, and a high voltage switch such as a thyratron to transfer the energy on the charging capacitor to the peaking capacitor. Other prior art pulse power systems use magnetic pulse compression circuits in order to provide the needed quick repetitive high voltage, high energy charging of the peaking capacitor. Examples are described in U.S. Pat. Nos. 5,448,580 and 5,313,481 which are incorporated herein by reference. These circuits normally utilize multi-stage LC networks which convert relatively long, relatively low voltage pulses into the needed very short high voltage pulses.

The prior art includes pulse power systems supplying very high voltage short pulses for industrial gas discharge lasers such as excimer lasers at pulse rates in the range of 1,000 Hz. These lasers need to operate reliably 24 hours per day for many weeks with only short down times for routine maintenance. There is a need for pulse power systems with increased reliability which can operate at pulse rates in the range of 2,000 Hz to 5,000 Hz or greater.

SUMMARY OF THE INVENTION

The present invention provides a high pulse rate pulse power source for supplying controlled high energy electrical pulses at rates of 2000 Hz or greater. The source includes a pulse generating circuit including a charging capacitor, a solid state switch and a current limiting inductor. Pulses generated in the pulse generating circuit are compressed in at least two pulse compression circuits and a step-up pulse transformer increases peak voltage to at least 12,000 volts. A very fast resonant regulated power supply is provided for charging the charging capacitor in less than 400 microseconds and a pulse control system, including a programmed processor, controls the charging of the charging capacitor to an accuracy of less than about one percent at a rate of at least 2000 charges per second.

A preferred embodiment of the present invention useful for providing electrical pulses for excimer lasers, provides pulses of up to 5.5 Joules per pulse at pulse rates up to 2000 Hz or greater. In this embodiment a peaking capacitor is charged with up to 5.5 Joules from zero voltage to a discharge voltage in the range of 16,000 volts in about 100 ns. This is substantially faster than prior art designs and provides significant improvements in lasing efficiency. This faster rise time is achieved using two stages of pulse compression and a 1:23 pulse transformer, with a four-sectioned straight stainless steel rod as a secondary "winding", in between the first and second stages. In this preferred embodiment pulse energy of each pulse is controlled with a feedback control system in which the energy of previous pulses are measured and the measurements are used to determine a control voltage for a charging capacitor. This charging capacitor is then charged to the control voltage using a regulated power supply. Extremely rapid precise charging is provided in which the charging capacitor is charged at the rate of about 3 volts per microsecond to a few volts in excess of the control voltage then bleed down through a bleed circuit to the control voltage.

DETAILED DESCRIPTION OF PREFERRED EMBODIMENTS

Preferred embodiments of the present invention can be described by reference to the drawings.

PULSE POWER SYSTEM FOR EXCIMER LASER

Figure 1:
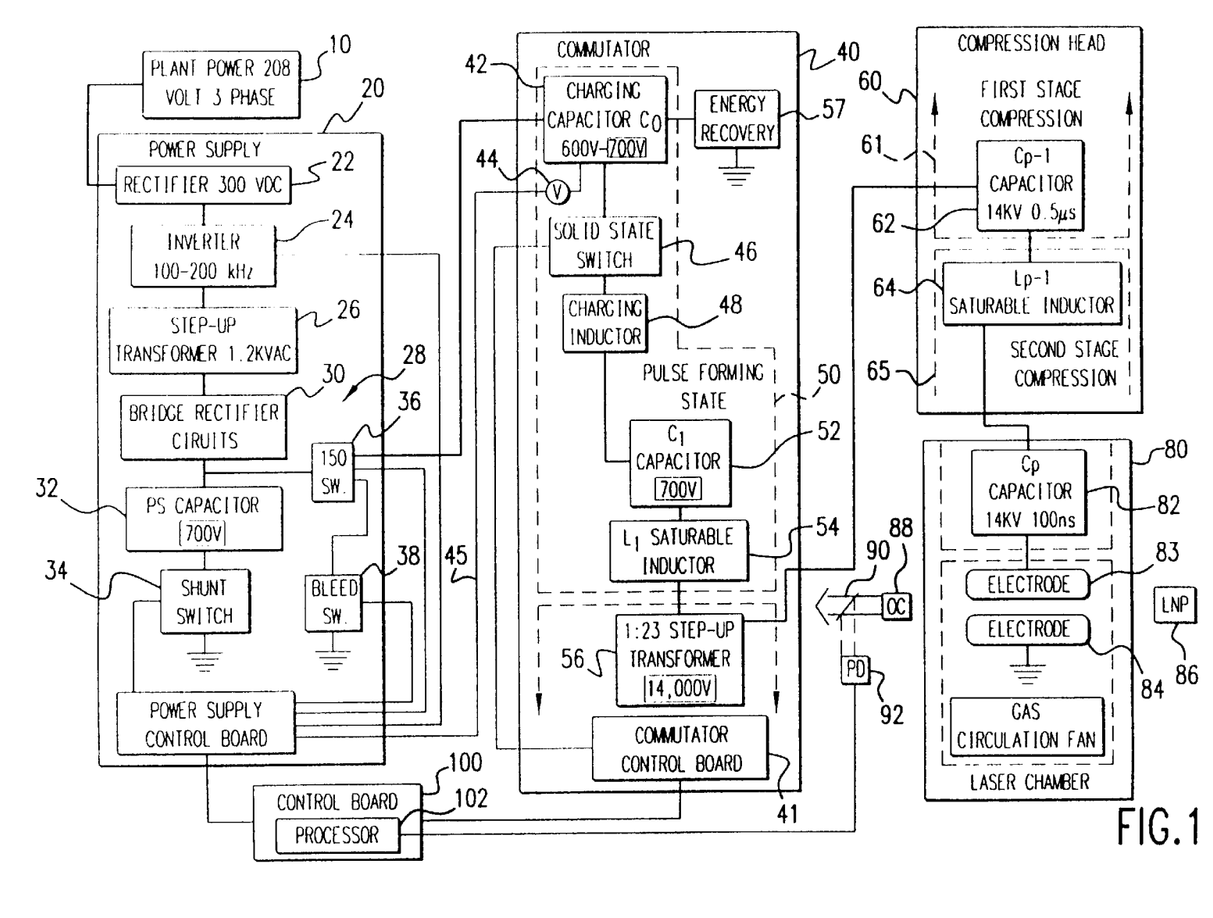
FIG. 1 is a block diagram of a preferred embodiment of the present invention.
Figure 2:
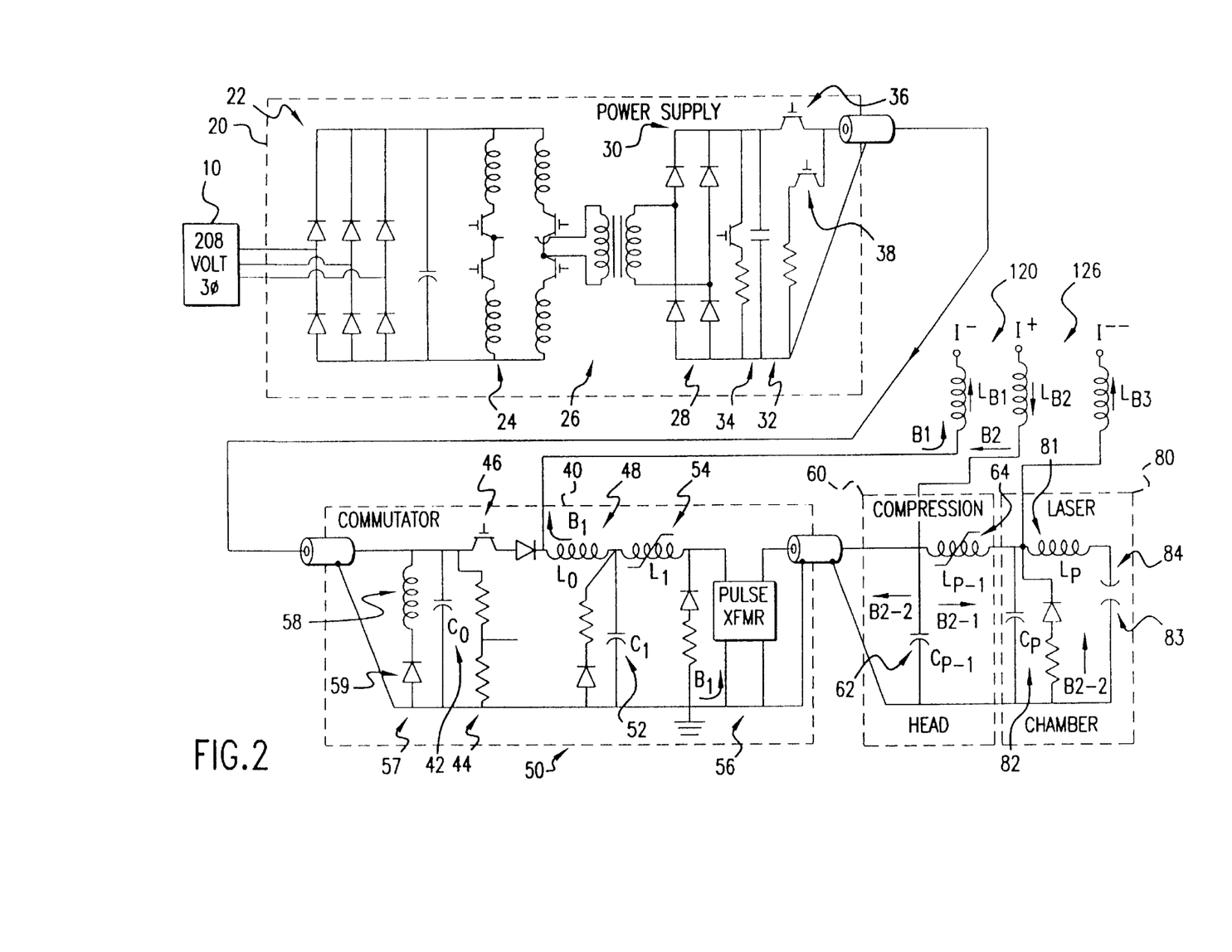
FIG. 2 is a simplified circuit diagram of the above preferred embodiment.

A pulse power system for an industrial narrow-band KrF excimer laser, is shown in block diagram form in FIG. 1. A simplified combination block and circuit diagram of this preferred embodiment is shown in FIG. 2. The diagrams show a preferred embodiment built and tested by the Applicants for converting 208 volt three phase standard plant alternating current into 0.5 Joule to 6 Joule, 12 kv to 22 kv electrical pulses on a peaking capacitor of the excimer laser at pulse rates in the range of 2,000 Hz or greater. A system description is first provided below followed by a more detailed description of some of the important details of the individual modules and components of the system.

SYSTEM DESCRIPTION

This system is manufactured in four separate modules as indicated in FIGS. 1 and 2, each of which becomes an important part of the excimer laser system and each of which can be quickly replaced in the event of a parts failure or in the course of a regular preventative maintenance program. These modules are designated by Applicants: high voltage power supply module 20, commutator module 40, compression head module 60 and laser chamber module 80.

High Voltage Power Supply Module

High voltage power supply module 20 comprises a 300 volt rectifier 22 for converting the 208 volt three phase plant power from source 10 to 300 volt DC. Inverter 24 converts the output of rectifier 22 to high frequency 300 volt pulses in the range 100 kHz to 200 kHz. The frequency and the on period of inverter 24 are controlled by the HV power supply control board 21 in order to provide course regulation of the ultimate output pulse energy of the system. The output of inverter 24 is stepped up to about 1200 volts in step-up transformer 26. The output of transformer 26 is converted to 1200 volts DC by rectifier 28 which includes a standard bridge rectifier circuit 30 and a filter capacitor 32. DC electrical energy from circuit 30 charges 8.1 $\mu$F Co charging capacitor 42 in commutator module 40 as directed by HV power supply control board 21 which controls the operation of inverter 24 as shown in FIG. 1. Set points within HV power supply control board 21 are set by laser system control board 100.

The reader should note that in this embodiment as shown in FIG. 1 that pulse energy control for the laser system is provided by power supply module 20. The electrical circuits in commutator 40 and compression head 60 merely serve to amplify and compress the electrical energy stored on charging capacitor 42 by power supply module 20. As an example of this control, FIG. 1 indicates that control board 100 has controlled the power supply to provide 700 volts to charging capacitor 42 which during the charging cycle is isolated from the down stream circuits by solid state switch 46.

Commutator Module

Commutator module 40 comprises Co charging capacitor 42, which in this embodiment is a bank of capacitors connected in parallel to provide a total capacitance of 8.1 $\mu$F. Voltage divider 44 provides a feedback voltage signal to the HV power supply control board 21 which is used by control board 21 to limit the charging of capacitor 42 to the voltage (called the "control voltage") which when formed into an electrical pulse and compressed and amplified in commutator 40 and compression head 60 will produce the desired discharge voltage on peaking capacitor 82 and across electrodes 83 and 84.

Figure 6A:
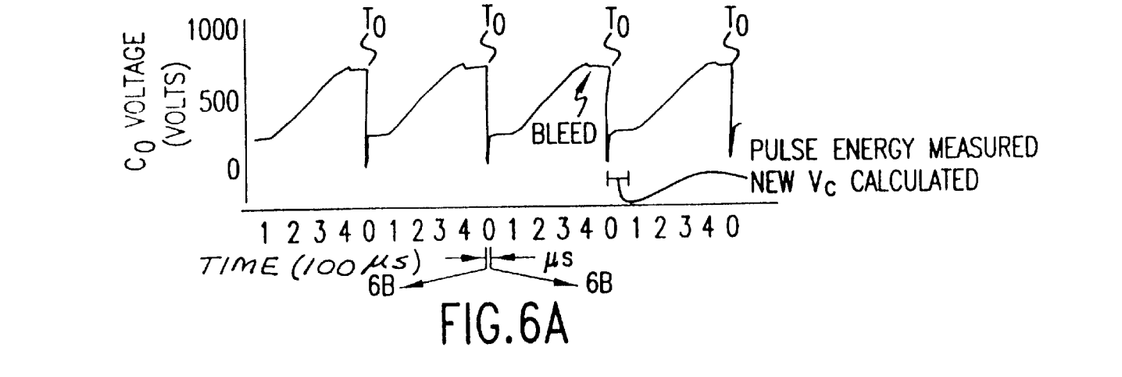
FIGS. 6A, 6B and 6C are time line charts showing pulse compression using the above preferred embodiment.

In this embodiment (designed to provide electrical pulses in the range of 3 Joules and 14,000 volts at a pulse rate of 2,000 pulses per second), about 250 microseconds (as indicated in FIG. 6A) are required for power supply 20 to charge the charging capacitor 42 to 700 volts. Therefore, charging capacitor 42 is fully charged and stable at the desired voltage when a signal from commutator control board 41 closes solid state switch 44 which initiates the very fast step of converting the 3 Joules of electrical energy stored on charging capacitor into a 14,000 volt discharge across electrodes 83 and 84. For this embodiment, solid state switch 46 is a IGBT switch, although other switch technologies such as SCRs, GTOs, MCTs, etc. could also be used. A 600 nH charging inductor 48 is in series with solid state switch 46 to temporarily limit the current through switch 46 while it closes to discharge the Co charging capacitor 42.

Pulse Generation Stage

Figure 6B:
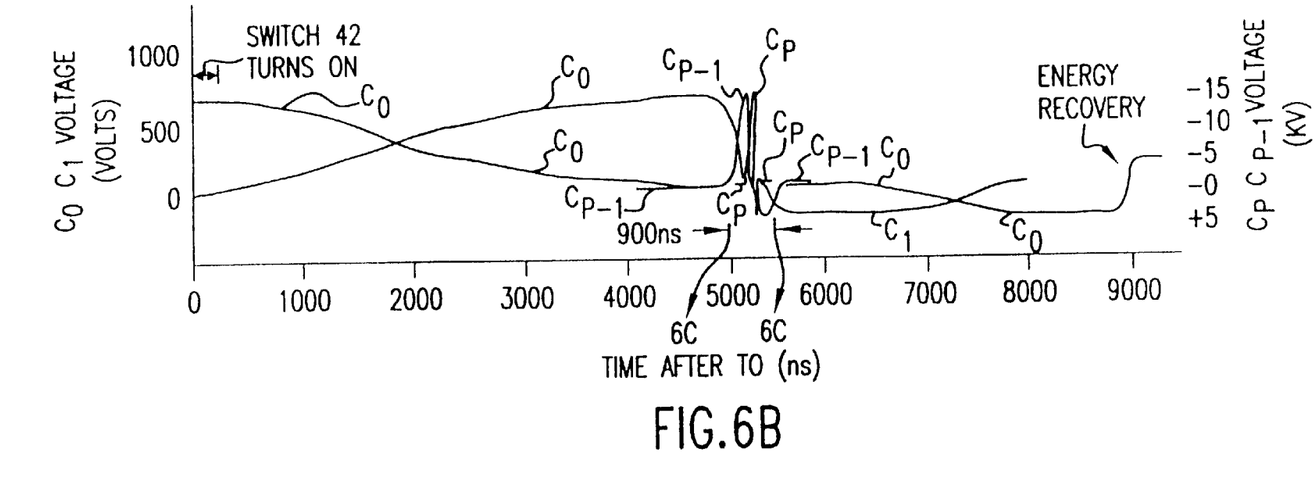

For the first stage of pulse generation 50, the charge on charging capacitor 42 is thus switched onto $C_1$ 8.5 $\mu$F capacitor 52 in about 5 $\mu$s as shown on FIG. 6B.

First Stage of Compression

Figure 6C:
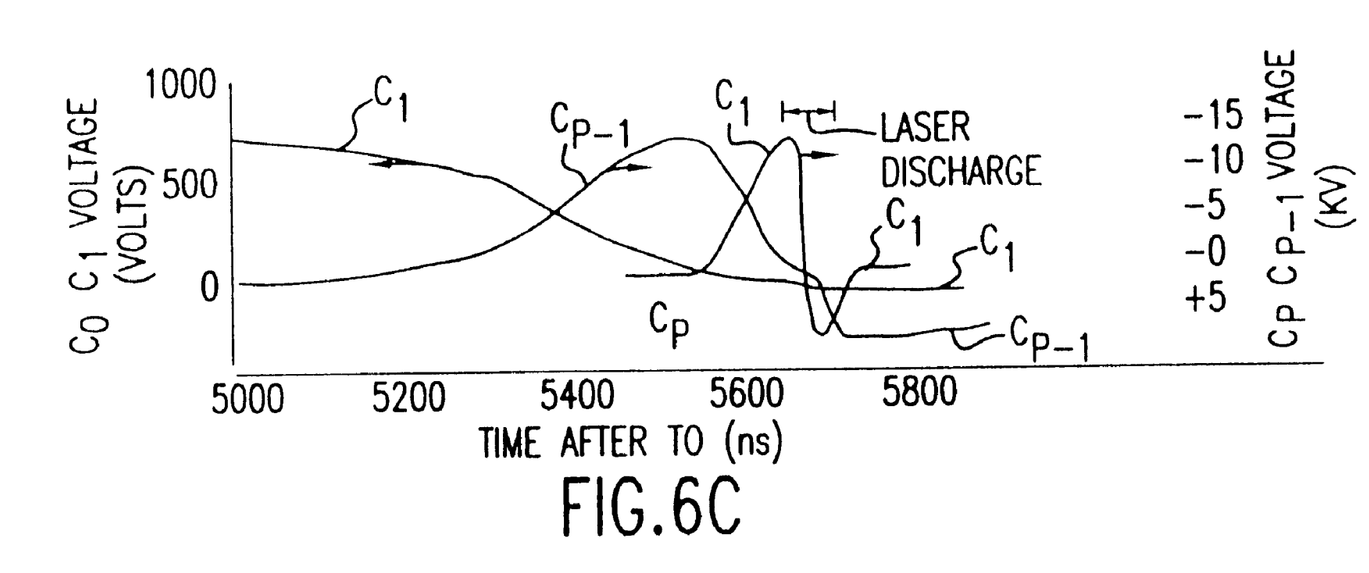

A saturable inductor 54 holds off the voltage on capacitor 52 and then becomes saturated allowing the transfer of charge from capacitor 52 through 1:23 step up pulse transformer 56 to $C_{p-1}$ capacitor 62 in a transfer time period of about 550 ns, as shown on FIG. 6C, for a first stage of compression 61.

The design of pulse transformer 56 is described below. Performance wise the transformer is an extremely efficient pulse transformer, transforming a 700 volt 17,500 ampere 550 ns pulse rate into a 16,100 volt, 760 ampere 550 ns pulse which is stored very temporarily on $C_{p-1}$ capacitor bank 62 in compression head module 60.

Compression Head Module

Compression head module 60 further compresses the pulse.

Second Stage of Compression

An $L_{p-1}$ saturable inductor 64 (with about 125 nH saturated inductance) holds off the voltage on 16.5 nF $C_{p-1}$ capacitor bank 62 for approximately 550 ns then allows the charge on $C_{p-1}$ to flow (in about 100 ns) onto 16.5 nF Cp peaking capacitor 82 located on the top of laser chamber 80 and which is electrically connected in parallel with electrodes 83 and 84. This transformation of a 550 ns long pulse into a 100 ns long pulse to charge Cp peaking capacitor 82 makes up the second stage and last of compression as indicated at 65 on FIG. 1.

Laser Chamber Module

About 100 ns after the charge begins flowing onto peaking capacitor 82 mounted on top of and as a part of the laser chamber module 80, the voltage on peaking capacitor 82 has reached about 14,000 volts and discharge between the electrodes begins. The discharge lasts about 50 ns during which time lasing occurs within the resonance chamber of the excimer laser. The resonance chamber is defined by a line narrowing package 86 comprised in this example by a 3-prism beam expander, a tuning mirror and an eschelle grating and an output coupler 88 which in this example, comprises a 10 percent R mirror. The laser pulse for this laser is a narrow band 20 ns 248 nm pulse of about 10 mJ and the repetition rate is 2000 pulses per second. The pulses define a laser beam 90 and the pulses of the beam are monitored by photodiode 92.

Control of Pulse Energy

The signal from photodiode 94 is transmitted to processor 102 in control board 100 and the processor uses this energy signal and preferably other historical pulse energy data to set the command voltage for the next and/or future pulses. In a preferred embodiment in which the laser operates in a series of short bursts (such as 100 pulse 0.5 second bursts at 2000 Hz separated by a dead time of about 0.1 second) processor 102 in control board 100 is programmed with a special algorithm which uses the most recent pulse energy signal along with the energy signal of all previous pulses in the burst along with other historical pulse profile data to select a control voltage for the subsequent pulse so as to minimized pulse-to-pulse energy variations and also to minimize burst-to-burst energy variations. This calculation is performed by processor 102 in control board 100 using this algorithm during a period of about 35 $\mu$s. The laser pulses occurs about 5 $\mu$s following the To firing of IGBT switch 46 shown on FIG. 6C and about 20 $\mu$s are required to collect the laser pulse energy data. (The start of the firing of switch 46 is called To.) Thus, a new control voltage value is thus ready (as shown on FIG. 6A) about 70 microseconds after the firing of IGBT switch 46 for the previous pulse (at 2,000 Hz the firing period is 500 $\mu$s). The features of this algorithm are described in greater detail in U.S. patent application Ser. No. 09/034,870 which is incorporated herein by reference.

Energy Recovery

This preferred embodiment is provided with electronic circuitry which recovers excess energy on charging capacitor 42 from the previous pulse which substantially reduces waste energy and virtually eliminates after ringing in the laser chamber 80.

This is accomplished by the energy recovery circuit 57, composed of energy recovery inductor 58 and energy recovery diode 59, the series combination of the two connected in parallel across Co charging capacitor 42. Because the impedance of the pulse power system is not exactly matched to that of the chamber and due to the fact that the chamber impedance varies several orders of magnitude during the pulse discharge, a negative going "reflection" is generated from the main pulse which propagates back towards the front end of the pulse generating system. After the excess energy has propagated back through the compression head 60 and the commutator 40, switch 46 opens up due to the removal of the trigger signal by the controller. The energy recovery circuit 57 reverses the polarity of the reflection which has generated a negative voltage on the charging capacitor 42 through resonant free wheeling (a half cycle of ringing of the L-C circuit made up of the charging capacitor 42 and the energy recovery inductor 58) as clamped against reversal of current in inductor 58 by diode 59. The net result is that substantially all of the reflected energy from the chamber 80 is recovered from each pulse and stored on charging capacitor 42 as a positive charge ready to be utilized for the next pulse. FIG. 6 is a time line chart showing the charges on capacitor Co, $C_1$, $C_{p-1}$ and Cp. The chart shows the process of energy recovery on Co.

Magnetic Switch Biasing

In order to completely utilize the full B-H curve swing of the magnetic materials used in the saturable inductors, a DC bias current is provided such that each inductor is reverse saturated at the time a pulse is initiated by the closing of switch 46.

In the case of the commutator saturable inductors 48 and 54, this is accomplished by providing a bias current flow of approximately 15 Å backwards (compared to the normal pulse current flow) through the inductors. This bias current is provided by bias current source 120 through isolation inductor Lb1. Actual current flow travels from the power supply through the ground connection of the commutator, through the primary winding of the pulse transformer, through saturable inductor 54, through saturable inductor 48, and through isolation inductor Lb1 back to the bias current source 120 as indicated by arrows B1.

In the case of compression head saturable inductor, a bias current B2 of approximate 5 Å is provided from the second bias current source 126 through isolation inductor Lb2. At the compression head, the current splits and the majority B2-1 goes through saturable inductor Lp-1 64 and back through isolation inductor Lb3 back to the second bias current source 126. A smaller fraction of the current B2-2 travels back through the HV cable connecting the compression head 60 and the commutator 40, through the pulse transformer secondary winding to ground, and through a biasing resistor back to the second bias current source 126. This second smaller current is used to bias the pulse transformer so that it is also reset for the pulsed operation. The amount of current which splits into each of the two legs is determined by the resistance in each path and is intentionally adjusted such that each path receives the correct amount of bias current.

Direction of Current Flow

In this embodiment, we refer to the flow of pulse energy through the system from the plant power source 10 to the electrodes and to ground beyond electrode 84 as "forward flow" and this direction as the forward direction. When we refer to an electrical component such as a saturable inductor as being forward conducting we mean that it is biased into saturation to conduct "pulse energy" in a direction toward the electrodes. When it is reverse conducting it is biased into saturation to conduct energy in a direction away from the electrodes toward the charging capacitor. The actual direction of current flow (or electron flow) through the system depends on where you are within the system. The direction of current flow is now explained to eliminate this as a possible source of confusion.

In this preferred embodiment Co is charged with (for example) a positive 700 volts such that when switch 46 is closed current flows from capacitor 42 through inductor 48 in a direction toward $C_1$ capacitor 52 (which means that electrons are actually flowing in the reverse direction). Similarly, the current flow is from C, capacitor 52 through the primary side of pulse transformer 56 toward ground. Thus, the direction of current and pulse energy is the same from charging capacitor 42 to pulse transformer 56. As explained below under the section entitled "Pulse Transformer" current flow in both the primary loops and the secondary loop of pulse transformer 56 are both toward ground. The result is that current flow between pulse transformer 56 and the electrodes during discharge is in the direction away from the electrodes toward transformer 56. Therefore, the direction of electron flow during discharge is from ground through the secondary of pulse transformer 56 temporarily onto $C_{p-1}$ capacitor 62 through inductor 64, temporarily onto Cp capacitor 82, through inductor 81, through electrode 84 (which is the discharge cathode) through the discharge plasma, through electrode 83 and back to ground. Thus, between pulse transformer 56, electrons flow in the same direction as the pulse energy during discharge.

Immediately following discharge currents and electron flow are reversed as explained above and special provisions have been made in this embodiment to deal with that reverse current flow as explained above in the section entitled Energy Recovery.

Detailed Power Supply Description

Figure 3:
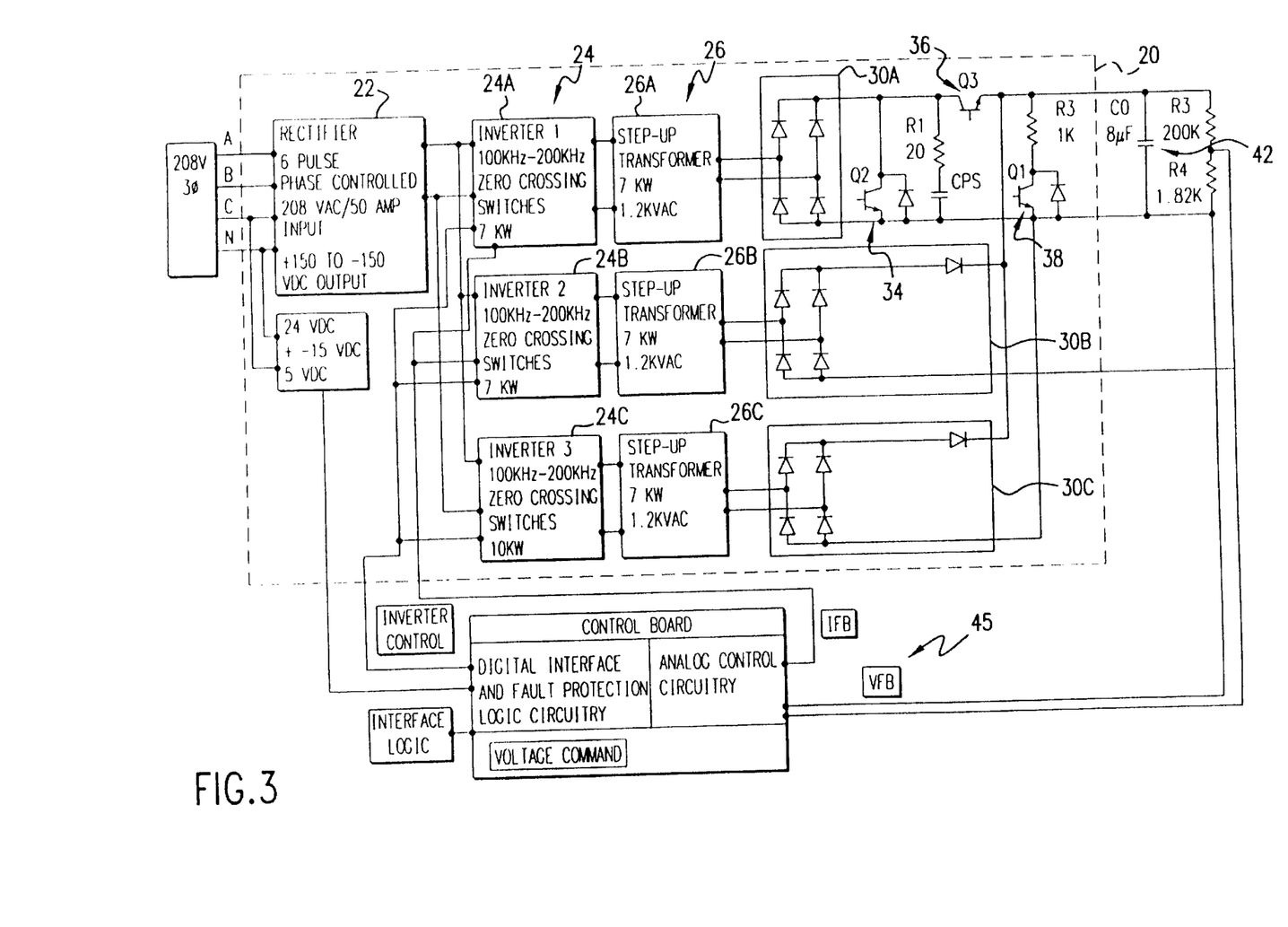
FIG. 3 is a combination block diagram, circuit diagram of a high voltage power supply which is part of the above preferred embodiment.

A more detailed circuit diagram of the power supply portion of the preferred embodiment is shown in FIG. 3. As indicated in FIG. 3, rectifier 22 is a 6 pulse phase controlled rectifier with a plus 150 v to −150 V DC output. Inverter 24 is actually three inverters 24A, 24B and 24C. Inverters 24B and 24C are turned off when the voltage on 8 $\mu$F Co charging capacitor 42 is 50 volts less than the command voltage and inverter 24A is turned off when the voltage on Co 42 slightly exceeds the command voltage. This procedure reduces the charge rate near the end of the charge. Step up transformers 26A, 26B and 26C are each rated at 7 kw and transform the voltage to 1200 volt AC.

Three bridge rectifier circuits 30A, 30B and 30C are shown. The HV power supply control board 21 converts a 12 bit digital command to an analog signal and compares it with a feedback signal 45 from Co voltage monitor 44. When the feedback voltage exceeds the command voltage, inverter 24A is turned off as discussed above, Q2 switch 34 closes to dissipate stored energy within the supply, Q3 isolation switch 36 opens to prevent any additional energy leaving the supply and Q1 bleed switch 38 closes to bleed down the voltage on Co 42 until the voltage on Co equals the command voltage. At that time Q1 opens.

Detailed Commutator and Compression Head Description

The principal components of commutator 40 and compression head 60 are shown on FIGS. 1 and 2 and are discussed above with regard to the operation of the system. In this section, we describe details of fabrication of the commutator.

Solid State Switch

Solid state switch 46 is an P/N CM 1000 HA-28H IGBT switch provided by Powerex, Inc. with offices in Youngwood, Pa.

Inductors

Figure 8A:
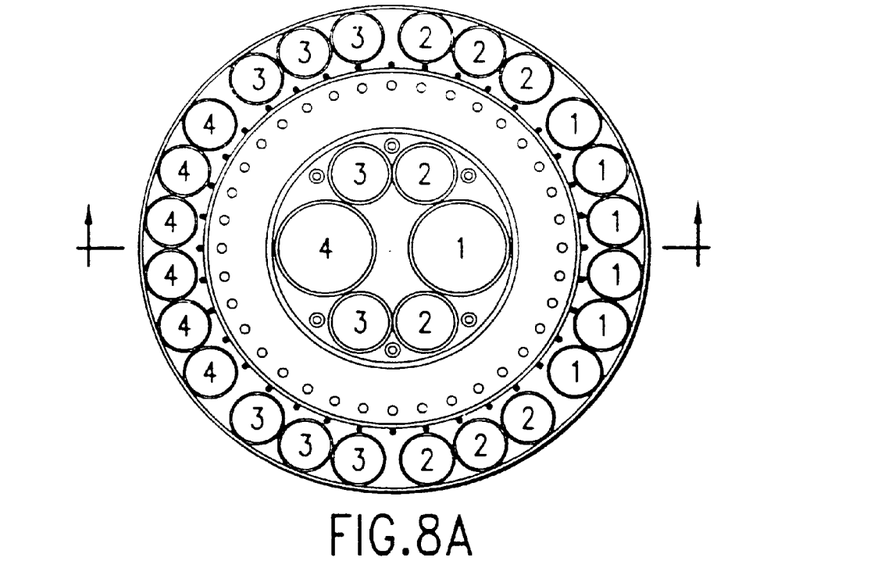
FIGS. 8A and 8B are drawing showing two views of a saturable inductor.
Figure 8B:
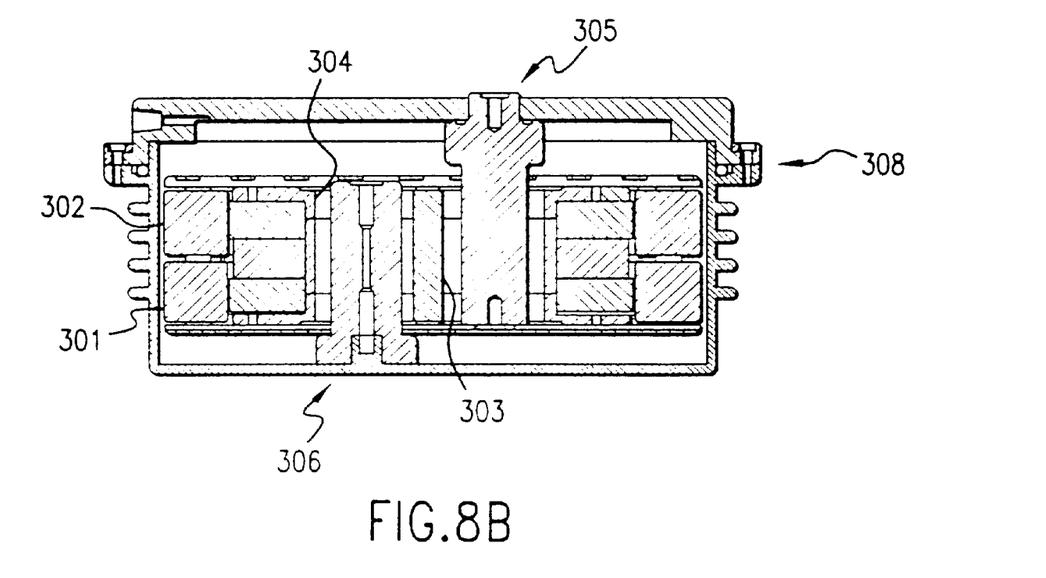

Inductors 48, 54 and 64 are saturable inductors similar to those described in U.S. Pat. Nos. 5,448,580 and 5,315,611. A top and section view of the saturable inductor 64 is shown respectively in FIGS. 8A and 8B. However, in the inductors of this embodiment, flux excluding metal pieces 301, 302, 303 and 304 are added as shown in FIG. 8B in order to reduce the leakage flux in the inductors. These flux excluding pieces substantially reduce current flow through the inductor prior to saturation and greatly improves the pulse forming performance of the inductor in the system. The current makes four loops through vertical conductors. It enters at 305 travels down a large diameter conductor in the center labeled "1" and up six smaller conductors on the circumference also labeled "1". Other loops are similarly numbered and exits at 306. There is one additional equivalent turn formed by the flux exclusion metal itself and is the third turn in a five turn inductor. This has an advantage in that the voltage of the flux exclusion metal components is held at half the full voltage allowing a reduction in the safe hold-off spacing between the flux exclusion metal parts and the metal rods of the other turns.

Capacitors

Capacitor banks 42, 52 and 62 are all comprised of banks of off-the-shelf capacitors connected in parallel. These capacitors are available from suppliers such as Murata with offices in Smyrna, Ga. Applicants preferred method of connecting the capacitors and inductors is to bolt them to positive and negative terminals on special printed circuit board having heavy nickel coated copper leads in a manner similar to that described ins U.S. Pat. No. 5,448,580.

Pulse Transformer

Figure 4:
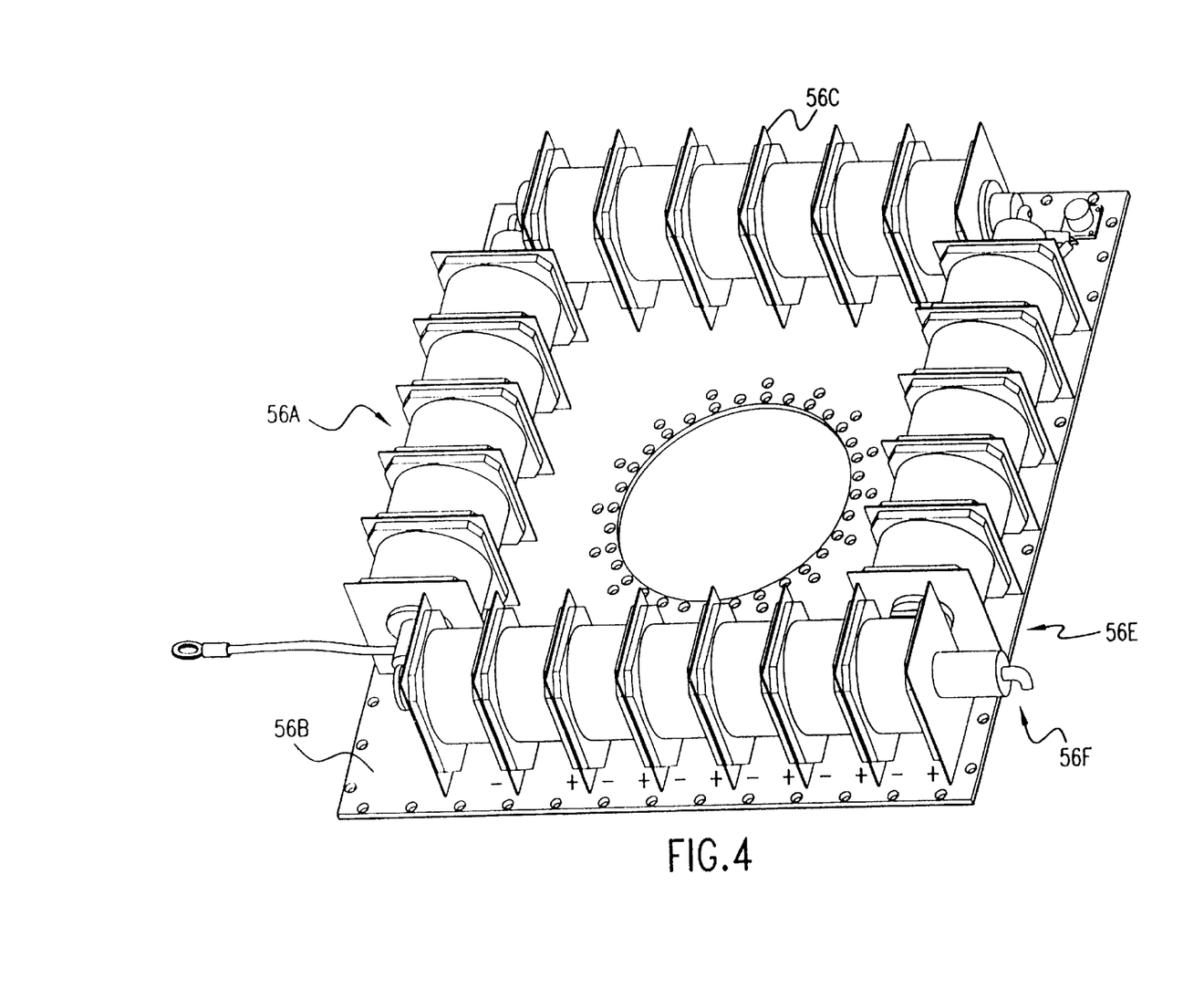
FIG. 4 is a prospective assembly drawing of a pulse transformer used in the above preferred embodiment.
Figure 5:
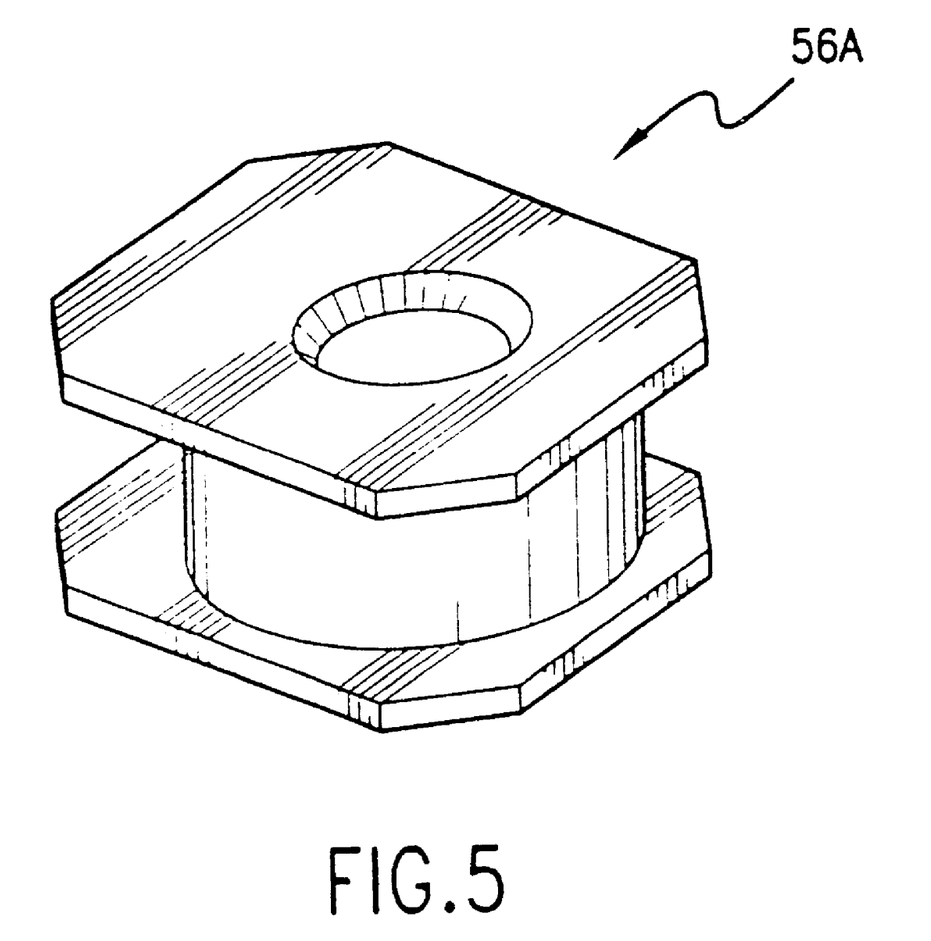
FIG. 5 is a drawing of a primary winding of a pulse transformer used in the above preferred embodiment.

Pulse transformer 56 is also similar to the pulse transformer described in U.S. Pat. Nos. 5,448,580 and 5,313,481; however, the pulse transformers of the present embodiment has only a single turn in the secondary winding and 23 primary windings. A drawing of pulse transformer 56 is shown in FIG. 4. Each of the 23 primary windings comprise an aluminum spool 56A having two flanges (each with a flat edge with threaded bolt holes) which are bolted to positive and negative terminals on printed circuit board 56B as shown along the bottom edge of FIG. 4. Insulators 56C separates the positive terminal of each spool from the negative terminal of the adjacent spool. Between the flanges of the spool is a hollow cylinder 1$\frac{1}{16}$ inches long with a 0.875 OD with a wall thickness of about $\frac{1}{32}$ inch. The spool is wrapped with one inch wide, 0.7 mil thick Metglas™ 2605 S3A and a 0.1 mil thick mylar film until the OD of the insulated Metglas™ wrapping is 2.24 inches. A prospective view of a single wrapped spool forming one primary winding is shown in FIG. 5.

The secondary of the transformer is a single OD stainless steel rod mounted within a tight fitting insulating tube of electrical glass. The winding is in four sections as shown in FIG. 4. The stainless steel secondary shown as 56D in FIG. 4 is grounded to a ground lead on printed circuit board 56B at 56E and the high voltage terminal is shown at 56F. As indicated above, a 700 volt pulse between the+and− terminals of the primary windings will produce a minus 16,100 volt pulse at terminal 56F on the secondary side. This design provides very low leakage inductance permitting extremely fast output risetime.

Details of Laser Chamber Electrical Components

The Cp capacitor 82 is comprised of a bank of 28 0.59 nf capacitors mounted on top of the chamber pressure vessel. (Typically a KrF laser is operated with a lasing gas made up of 1.0% krypton, 0.1% fluorine, and the remainder neon.) The electrodes are each solid brass bars about 28 inches long which are separated by about 0.5 to 1.0 inch. In this embodiment, the top electrode is the cathode and the bottom electrode is connected to ground as indicated in FIG. 1.

OTHER EMBODIMENTS

Reverse Polarization

In the system described above Co is charged with a positive voltage and the flow of electrons is into the ground electrode of the laser chamber. The circuit can be easily reversed with Co charged to a negative charging voltage of about 700 volts and the electron flow will be from the ground electrode to the high voltage electrodes. Also reverse flow of electrons across the electrode gap could be accomplished by changing the polarity of the secondary winding (i.e., the four-section stainless steel tube).

Bipolar Operation

Figure 7:
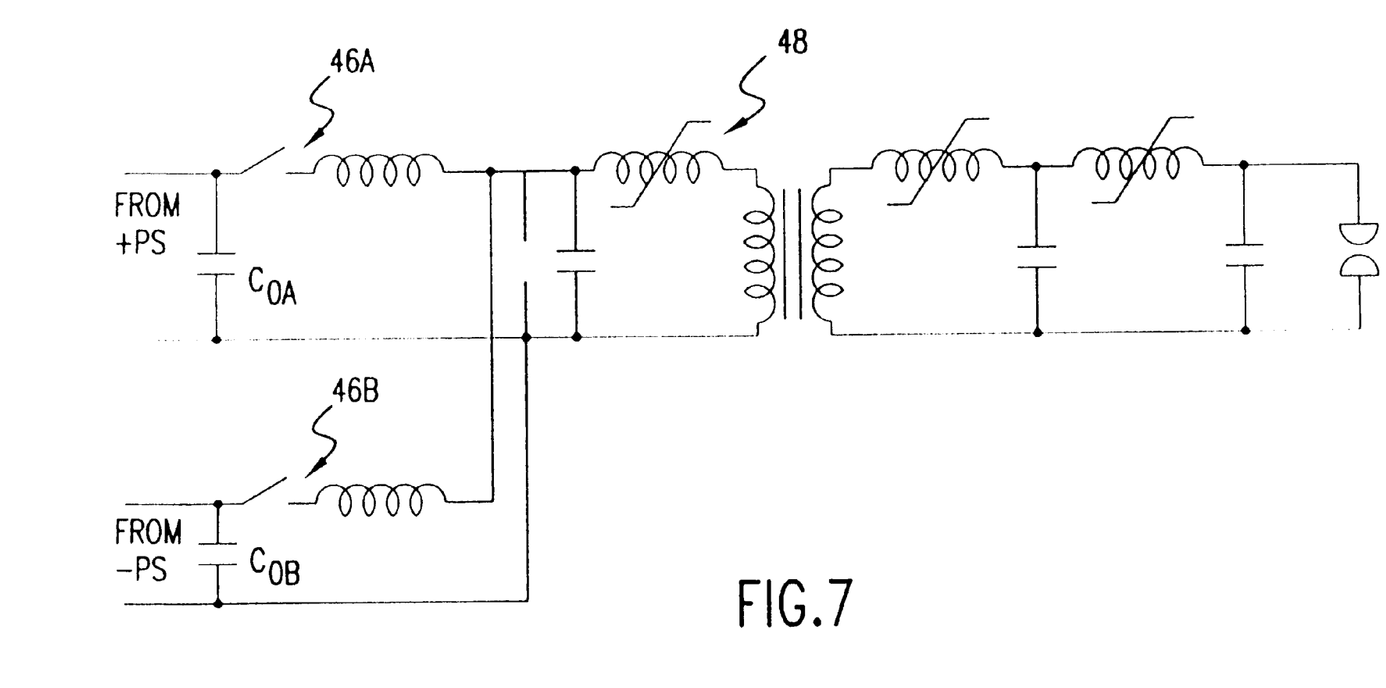
FIG. 7 is a simplified circuit diagram for providing bipolar pulses.

FIG. 7 shows a modification which would permit bi-polar operation of the laser. In this case, two power supplies are provided one supplying +1200 volts and the other providing −1200 volts. In addition, switch 46 is duplicated so that we have 46A and 46B. When 46A is closed the polarity of system is like that described in detail above. However, with 46A open and switch 46B closes the resulting pulse is everywhere reversed and the electron flow across the discharge gap is from the ground electrode to the high voltage electrode (in this case about +14,000 volts). In this case, the energy recovery circuit 57 is not needed. Instead (for example) Co$_A$ is charged to +700 v at To 46A will close allowing Co$_A$ to discharge through inductor 48 then it will open and 46B will close permitting the reflected energy to be recovered on Co$_B$ after recovery of the energy 46B opens. Then Co$_B$ is charged to −700 v and at the next To 46B closes allowing Co$_B$ to discharge through the circuit. The result is alternating discharge directions. This embodiment should provide for more even wear of the electrodes.

Compression Head Mounting

Figure 10A:
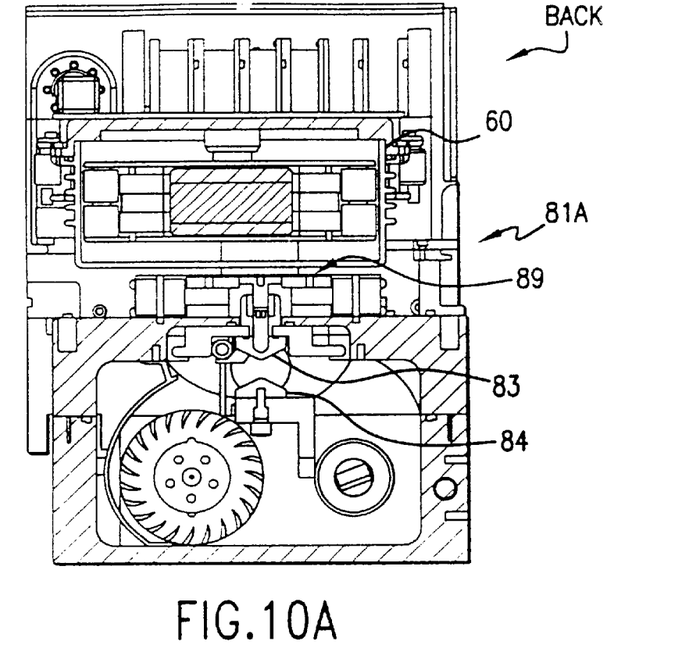
FIGS. 10A and 10B shows the mounting of a compression lead in a preferred embodiment
Figure 10B:
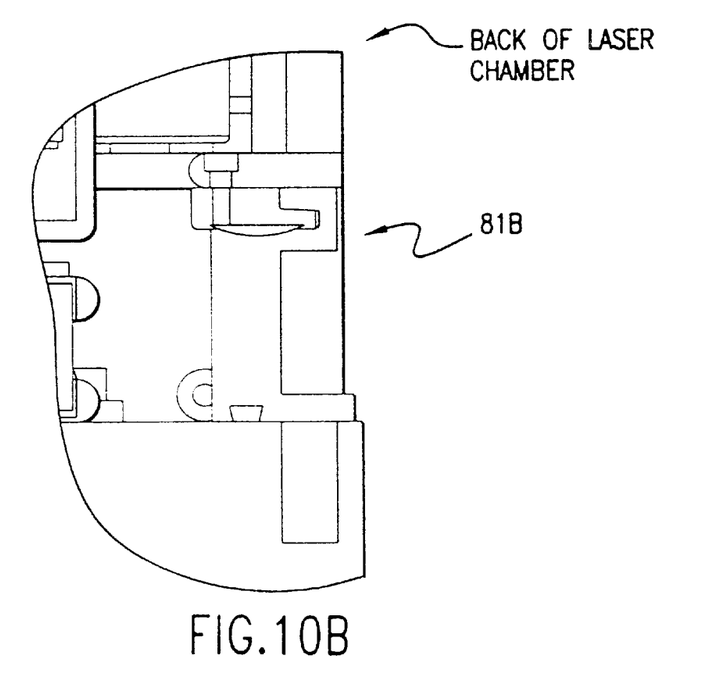

This preferred embodiment of the present invention includes a compression head mounting technique shown in FIGS. 10A and 10B. FIG. 10 is a side section view of the laser system showing the location of the compressor lead module in relation to electrodes 83 and 84. This technique was designed to minimize the impedance associated with the compression lead chamber connection and at the same time facilitates quick replacement of the compression head. As shown in FIGS. 10A and 10B the ground connection is made with an approximately 28 inch long slot tab connection along the back side of the compression head as shown at 81A in FIG. 10A and 81B in FIG. 10B. The top of the slot is fitted with flexible finger stock. A preferred finger stock material is sold under the trade name Multilam®.

The high voltage connection is made between a six-inch diameter smooth bottom of saturable inductor 64 and a mating array of flexible finger stock at 89 in FIG. 10A. As above, a preferred finger stock material is Multilam®. This arrangement permits the replacement of the compression head module for repair or preventative maintenance in about five minutes.

Pots and Pans Housing for Saturable Inductors

In prior art pulse power systems, oil leakage from electrical components has been a problem. In this preferred embodiment, oil insulated components are limited to the saturable inductors. Furthermore, the saturable inductors as shown in FIG. 8B are housed in a pot type oil containing housing in which all seal connections are located above the oil level to substantially eliminate the possibility of oil leakage. For example, the lowest seal in inductor 64 is shown at 308 in FIG. 8B.

RESONANT CHARGING

In a preferred embodiment of the present invention, the power supply module described for the first preferred embodiment which utilizes two rectifiers, an inverter and a transformer as shown in FIGS. 1 and 2; is replaced by an off-the-shelf power supply and a resonance charging circuit. This latter approach provides much faster charging of the charging capacitor.

First Resonant Charger

Figure 9A:
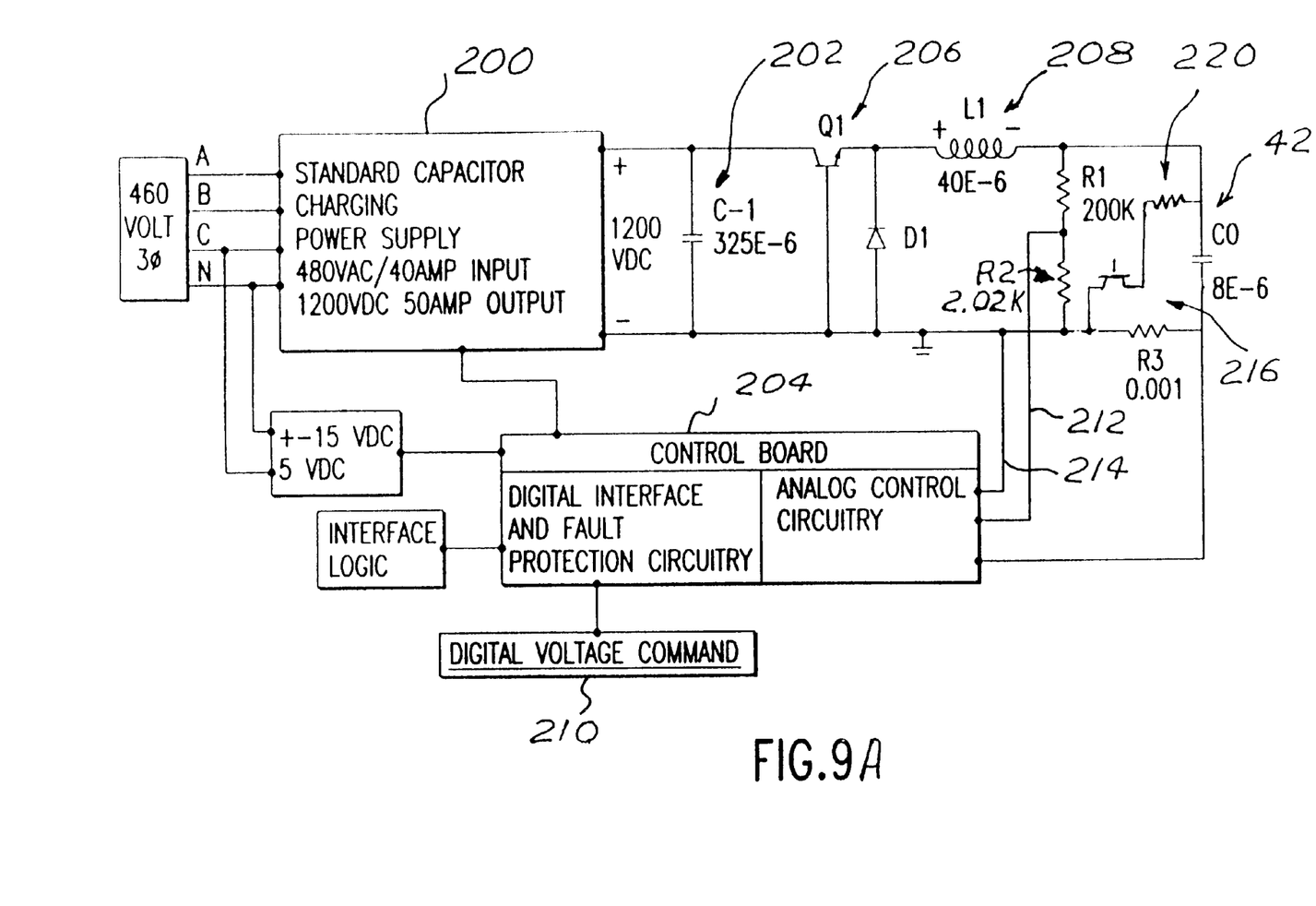
FIGS. 9A and 9B is a circuit drawing showing a resonance power supply.

An electrical circuit showing this preferred embodiment is shown in FIG. 9A. In this case, a standard capacitor charging power supply 200 having a 480 VAC/40 amp input and a 1200 VDC 50 amp output is used. Such power supplies are available from suppliers such as Ecgar, Maxwell, Kaiser and Ale. This power supply continuously charges a 325 $\mu$F capacitor 202 to the voltage level commanded by the control board 204. The control board 204 also commands IGBT switch 206 closed and open to transfer energy from capacitor 202 to capacitor 42. Inductor 208 sets up the transfer time constant in conjunction with capacitor 202 and 42. Control board 202 receives a voltage feedback 212 that is proportional to the voltage on capacitor 42 and a current feedback 214 that is proportional to the current flowing through inductor 208. From these two feedback signals control board 204 can calculate in real time the final voltage on capacitor 42 should IGBT switch 206 open at that instant of time. Therefore with a command voltage 210 fed into control board 204 a precise calculation can be made of the stored energy within capacitor 42 and inductor 208 to compare to the required charge voltage commanded 210. From this calculation, the control board 204 will determine the exact time in the charge cycle to open IGBT switch 206.

After IGBT switch 206 opens the energy stored in the magnetic field of inductor 208 will transfer to capacitor 42 through the diode path 216. The accuracy of the real time energy calculation will determine the amount of fluctuation dither that will exist on the final voltage on capacitor 42. Due to the extreme charge rate of this system, too much dither will exist to meet a desired systems regulation need of ±0.05%. Therefore a bleed down circuit is included in this embodiment.

Bleed down circuit 216 will be commanded closed by the control board 204 when current flowing through inductor 208 stops. The time constant of capacitor 42 and resistor 220 should be sufficiently fast to bleed down capacitor 42 to the command voltage 210 without being an appreciable amount of the total charge cycle.

Second Resonant Charger

Figure 9B:
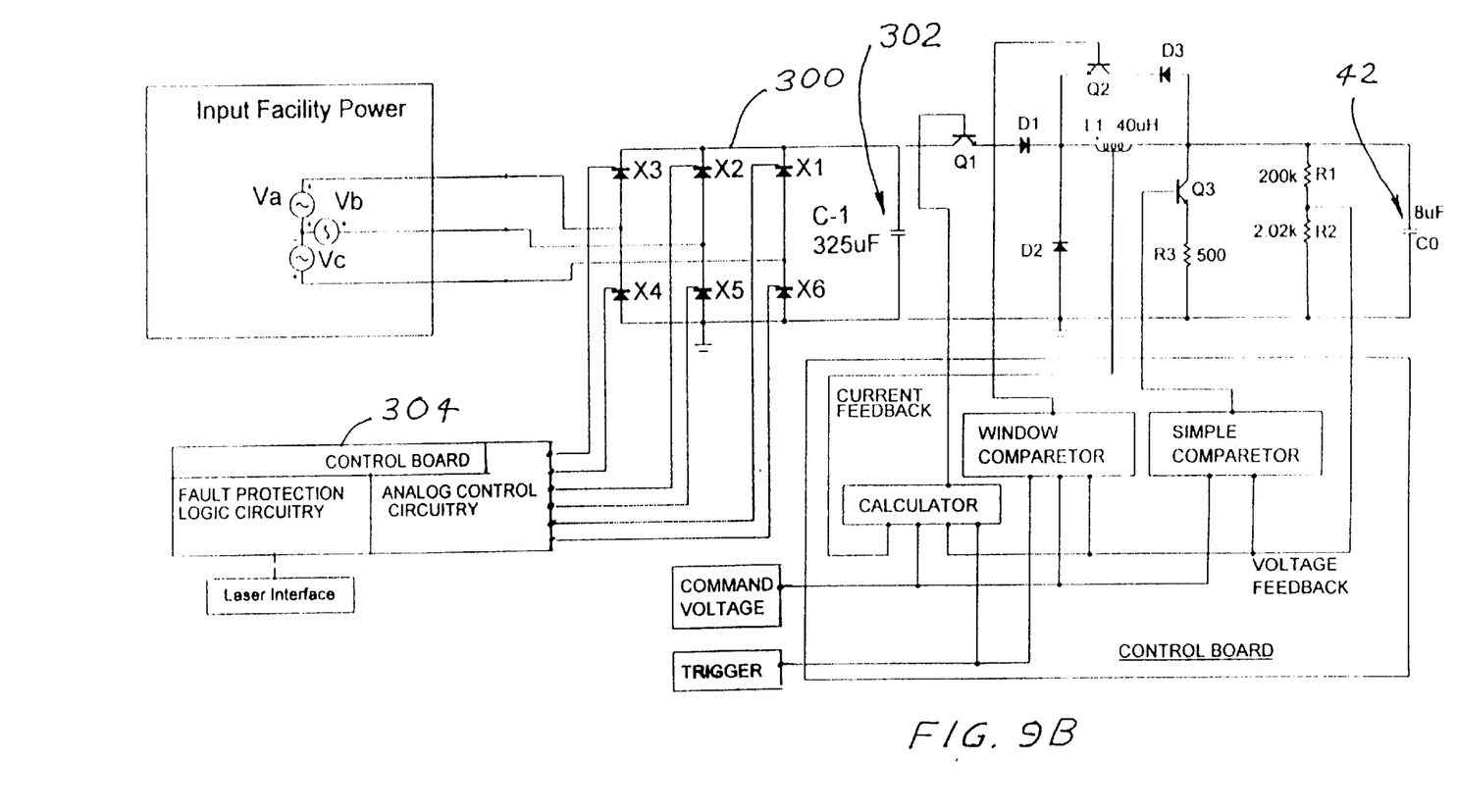

A second resonant charger system is shown in FIG. 9B. This circuit is similar to the one shown in FIG. 9A. The principal circuit elements are:

I1 - A three-phase power supply 300 with a constant DC current output.

C-1 - A source capacitor 302 that is an order of magnitude or more larger than the existing C0 capacitor 42.

Q1, Q2, and Q3 - Switches to control current flow for charging and maintaining a regulated voltage on C0.

D1, D2, and D3 - Provides current single direction flow.

R1, and R2 - Provides voltage feedback to the control circuitry.

R3 - Allows for rapid discharge of the voltage on C0 in the event of a small over charge.

L1 - Resonant inductor between C-1 capacitor 302 and C0 capacitor 4-2 to limit current flow and setup charge transfer timing.

Control Board 304 - Commands Q1, Q2, and Q3 open and closed based upon circuit feedback parameters.

The power supply is a fixed 700-volt power supply. The power supply is attached directly to C-1 eliminating the need for voltage feedback to the supply. When the supply is enabled it turns on and regulates a constant current output until the voltage on C1 capacitor 302 is 700 volts, and then it turns off.

The performance of the system is independent of the voltage regulation on C-1 therefore only the most basic control loop is necessary in the power supply. Secondly the supply will be adding energy into the system whenever the voltage on C-1 falls below the 700-volt setting. This allows the power supply the entire time between laser pulse, (and even during laser pulses), to replenish energy transferred from C-1 to C0. This further reduces the power supply peak current requirements over the pulse power system described above. As can be seen in FIG. 6A the power supply is only given a percentage of the total time between laser pulses to charge C0 to a desired voltage. The combination of requiring a supply with the most basic control loop, and minimizing the peak current rating of the supply to the average power requirements of the system reduces the power supply cost an estimated 50%. Additionally this preferred design provides vendor flexibility since constant current, fixed output voltage power supplies are readily available from multiple sources.

In order to utilize the most basic power supply available on the market, additional circuitry is added that is estimated at a small fraction of the total power supply savings. These additional components are outlined above with the exception of C0 which is a part of the commutator. An example of operation is as follows:

Prior to the need for a laser pulse the voltage on C-1 would be charged to 700 volts, switches Q1, and Q3 would be open, and Q2 would be closed. Upon command from the laser, Q1 would close and Q2 would open. At this time current would flow from C-1 to C0 through the charge inductor L1. On the control board would be a calculator that is evaluating the voltage on C0, and the current flowing in L1 relative to a command voltage set point from the laser. Q1 will open when the voltage on C0 plus the equivalent energy stored in inductor L1 equals the desired command voltage plus 100 volts. The calculation is:

$$V_f = [V_{C0s}^2 + ((L_1 * I_{L1s}^2)/C_0)]^{0.5} + 100 \tag{1}$$

Where:

$V_f$=The voltage on C0 after Q1 opens and the current in L1 goes to zero.

$V_{C0s}$=The voltage on $C_0$ when Q1 opens.

$I_{L1s}$=The current flowing through $L_1$ when Q1 opens.

The reason for adding 100 volts to the calculation is to ensure current is still flowing in L1 at the time the voltage on C0 equals the command voltage.

After Q1 opens the energy stored in L1 starts transferring to C0 through D2 until the voltage on C0 equals the command voltage. At this time Q2 closes and current stops flowing to C0 and is directed through D3 to produce a "flywheel current loop." A window comparator is used to control the on off switching of Q2. Should the voltage on C0 drop below the command voltage less 0.5 volts then Q2 will open and charge current held in L1 will flow to C0 until the voltage on C0 equals the command voltage plus 0.5 volts.

Should for any reason the voltage on C0 exceed the command voltage plus 0.6 volts then Q3 will closed until the voltage on C0 drops to the command voltage plus 0.6 volts. This ensures the voltage regulation has a 0.6 volt variation worst case at the time the laser pulses.

With the above circuit, and a starting charge voltage on C-1 of 700 volts, the maximum first pulse voltage on C0 will be 1400 volts. For this embodiment, the maximum operating voltage will be 1200 volts. This allows the system to hold up to 200 volts of charge in L1 for reserve. This reserve can be incrementally pulsed onto C0 as needed due to leakage losses during the time after C0 equals the command voltage and the laser discharging C0.

In the above application a complex power supply with peak current ratings exceeding the system average current ratings is replaced with one that is much less complicated. A power supply that is far less sophisticated with the average current rating equal to the peak current rating is estimated to result in a 50% savings. An additional 10% of this savings is estimated to go back into the circuit outlined above. This results in an estimated savings of 40%.

Persons skilled in the art will recognize that many other embodiments of the present invention are possible based on the teachings expressed in the above disclosure. Many of the parameters such as voltage and energy values could be different. For commercial excimer lasers used for lithography charging rates of at least 1000 Hz are preferred but much faster rates, such as 2000 Hz or as fast as 5000 Hz or greater, will be desirable. Preferably the charging capacitor charging voltage will be in the range of 600 volts or greater; and the charge energy for each charge should preferably be at least 3 Joules. Therefore, the reader should determine the scope of the present invention by the appended claims and their legal equivalents.

We claim:

1. A high pulse rate pulse power source comprising:
   A) a pulse generating circuit, comprising:
      1) a charging capacitor for storing a charge at voltages in excess of 600 volts,
      2) a solid state switch, and
      3) a current limiting inductor,
   for generating electrical pulses with electrical energy in excess of 3 Joules and with peak voltages in excess of 600 volts;
   B) at least two pulse compression circuits, defining a first compression circuit and a second compression circuit, each compression circuit comprising a bank of capacitors and a saturable inductor;
   C) step-up pulse transformer for increasing the peak voltage of the electrical pulses to at least 12,000 volts said pulse transformer comprising a plurality of electrically parallel primary windings and a secondary winding comprises at least one substantially straight conductor,
   D) a very fast regulated resonant power supply for periodically charging, at charging rates of at least 2000 charges per second, said charging capacitor with at least 3 Joules of electrical energy at voltages of at least 600 volts, in less than 400 microseconds, and
   E) a very fast pulse control system comprising a processor for controlling the charging of said charging capacitor to an accuracy of less than one percent at a rate at least 2000 charges per second.

2. A high pulse rate pulse power source as in claim 1 wherein said very fast power supply comprises a power supply resonance circuit comprising:
   A) a source capacitor having a capacitance at least five times said charging capacitor capacitance;
   B) a DC power supply rated at at least 7 kW for supplying electric power at at least 300 volts to said source capacitor;
   C) a current limiting power supply inductor for limiting current flow from said source capacitor to said charging capacitor;
   D) a solid state switch connected in series with said source capacitor, said current limiting power supply inductor and said charging capacitor
   wherein said charging capacitor is charged by closing said solid state switch.

3. A high pulse rate pulse power source as in claim 2 wherein said power supply resonance circuit also comprises a bleed down circuit for bleeding the voltage on said charging capacitor down to a predetermined desired value.

4. A high pulse rate pulse power source as in claim 2 wherein said power supply resonance circuit further comprises flywheel current loop comprising said current limiting power supply inductor, a diode and a solid state fly wheel current loop.

5. A high pulse rate pulse power source as in claim 4 wherein said processor is programmed to close said fly wheel current loop switch when voltage on said charging capacitor rises to a first predetermined value.

6. A high pulse rate pulse power source as in claim 5 wherein said processor is further programmed to open said flywheel current loop switch when voltage on said charging capacitor decreases to a second predetermined value.

* * * * *